United States Patent [19]

Futami et al.

[11] 4,370,735

[45] Jan. 25, 1983

[54] MAGNETIC BUBBLE MEMORY DEVICE

[75] Inventors: Toshio Futami; Kazutoshi Yoshida, both of Mobara, Japan

[73] Assignee: Hitachi, Ltd., Tokyo, Japan

[21] Appl. No.: 191,503

[22] Filed: Sep. 29, 1980

[51] Int. Cl.³ .............................................. G11C 19/08
[52] U.S. Cl. ......................................... 365/16; 365/1; 365/12
[58] Field of Search ..................... 365/1, 12, 15, 16, 11

[56] References Cited

U.S. PATENT DOCUMENTS 4,101,971  7/1978  Hiroshima et al. .................... 365/11
4,120,042 10/1978  Kasai et al. ............................ 365/11

Primary Examiner—James W. Moffitt
Attorney, Agent, or Firm—Charles E. Pfund

[57] ABSTRACT

A magnetic bubble memory device having a bubble generator which generates a magnetic bubble by conducting a pulse current on its hairpin-shaped conductor loop and a major propagation circuit for propagating the magnetic bubble to a transfer-in gate circuit which transfers the magnetic bubble to a memory storage region, wherein the device further comprises a gate means provided between the bubble generator and the major propagation circuit for transferring a magnetic bubble carrying information "1" onto the major propagation circuit at a first predetermined timing and preventing a spurious bubble to be transferred to the major propagation circuit at a second predetermined timing.

4 Claims, 6 Drawing Figures

MAGNETIC BUBBLE MEMORY DEVICE

BACKGROUND OF THE INVENTION

The present invention relates to a magnetic bubble memory device, and more particularly to the improvement of the information propagating structure for directing information generated by the magnetic bubble generator to the storage region.

Generally, magnetic bubbles are generated on a portion of the propagation pattern with positional relationship between the propagation pattern of the write propagation circuit and the generator pattern properly arranged.

FIG. 1 is an enlarged plan view showing an example of the overall structure of the conventional magnetic bubble memory device, where reference number 1 denotes a magnetic bubble memory chip, 2 a minor loop functioning as a storage of information, 3 a read major line for propagating write-in information. Reference number 5 denotes a magnetic bubble detector for converting magnetic bubbles into electrical signals, 6 a hairpin-shaped magnetic bubble generator, 7 a replicate gate circuit for replicating or transferring information in minor loop 2 onto read major line 3, and 8 a transfer-in gate circuit for transferring information on write major line 4 into minor loop 2. Reference number 9 denotes guard rail, surrounding the above-mentioned circuits so as to shut out external magnetic bubbles, and 10 bonding pads.

FIG. 2 is a partial enlarged plan view of the magnetic bubble generator 6 and its neighbors shown in FIG. 1, where reference number 11 indicates magnetic bubble propagation circuit elements which are formed of the micro-patterned soft ferromagnetic thin film of such as permalloy. A large number of propagation circuit elements 11 are disposed contiguously to form a magnetic bubble propagation circuit 12, and ultimately the above-mentioned write major line 4 is constructed. Reference number 13 denotes a hairpin-shaped conductor loop which conducts a pulse current I for writing information. The conductor loop 13 is made on a non-magnetic conductor such as Al-Cu or Al-Cr, and disposed to intersect the magnetic bubble propagation circuit 12. Reference number 14 indicates a rotating magnetic field (HR) applied from outside to the circuit patterns in the counterclockwise direction, so that magnetic bubbles are propagated to the left (shown by arrow P). Reference number 15 denotes a bias magnetic field (HB) applied perpendicularly to the drawing and in a direction in which the flux comes out of the drawing, for stabilizing the propagation of magnetic bubbles on the propagation circuit 12.

In the magnetic bubble generator having the structure as described above, information "1" is written in the following manner. First, a pulse current $I_1$ is supplied to conductor loop 13 when the rotating field (HR) is oriented to approximately 0°. The pulse current $I_1$ flows in the direction so that the strength of the bias field (HB) 15 is weakened, and thus a magnetic bubble B1 is generated inside the hairpin loop of conductor loop 13. As the rotating field (HR) 14 rotates, the magnetic bubble B1 is propagated to the left (shown by arrow P) on propagation circuit 12. A magnetic bubble Bo is one which has been generated and propagated from conductor loop 13.

Current $I_1$ is supplied to conductor loop 13 corresponding to information "1" and no current is supplied for information "0", so that a binary information pattern is written on propagation circuit 12. Data carrier bubbles $B_o$ and $B_1$ written onto propagation circuit 12 are propagated by the rotation of the rotating field (HR) along the propagation circuit, i.e., write major line 4 in FIG. 1, and then transferred through transfer gate circuit 8 into minor loop 2 for storing. In applying the generator of FIG. 2 as generator 6 in FIG. 1 the orientation of the hairpin loop (open to the right) and the direction of propagation P (initially downward and then clockwise to propagate on major write line 4 from left to right) will be observed.

However, in the magnetic bubble generator structured as described above, when a pulse current I is supplied to conductor loop 13 to generate a magnetic bubble carrying information "1", particularly when magnetic bubble generation is repeated for a long time, unwanted spurious bubbles $B_2$ are created in region A inside hairpin-shaped conductor loop 13 in addition to data carrier bubble $B_1$. When information "0" is intended to write in with the pulse current $I_1$ being suppressed, a spurious bubble $B_2$ enters propagation circuit 12 causing it to write information "1". The written spurious bubble $B_2$ is propagated by the rotating field (HR) along propagation circuit 12, i.e., write major line 4, and transferred through transfer gate circuit 8 to minor loop 2. Storing of spurious bubbles in minor loop 2 means an error in stored data. Particularly, when information "0" has been written in following a string of "1", the last information can be erroneously read out as "1".

SUMMARY OF THE INVENTION

It is, therefore, an object of the present invention to provide a magnetic bubble memory device which is free from the above-mentioned erroneous operation in prior art and also has enhanced reliability for write operation.

In order to accomplish the above object, the present invention provides a magnetic bubble memory device comprising a bubble generator which generates a bubble carrying information "1" by conducting a pulse current on its hairpin-shaped conductor loop and creating a data having information "0" by suppressing the pulse current, a major propagation circuit for propagating the magnetic bubble to a transfer-in gate circuit which transfers the magnetic bubble to memory storage regions, and a gate means provided between said magnetic bubble generator and said major propagation circuit for transferring a magnetic bubble carrying information "1" at a first predetermined timing and preventing spurious bubbles from being transferred to the major propagation circuit at a second predetermined timing.

DESCRIPTION OF THE PREFERRED EMBODIMENTS

The invention will now be explained by way of example referring to FIG. 3, where the same reference numbers are used for identical portions in FIG. 1 and explanation of these portions will be omitted.

Figure 1:
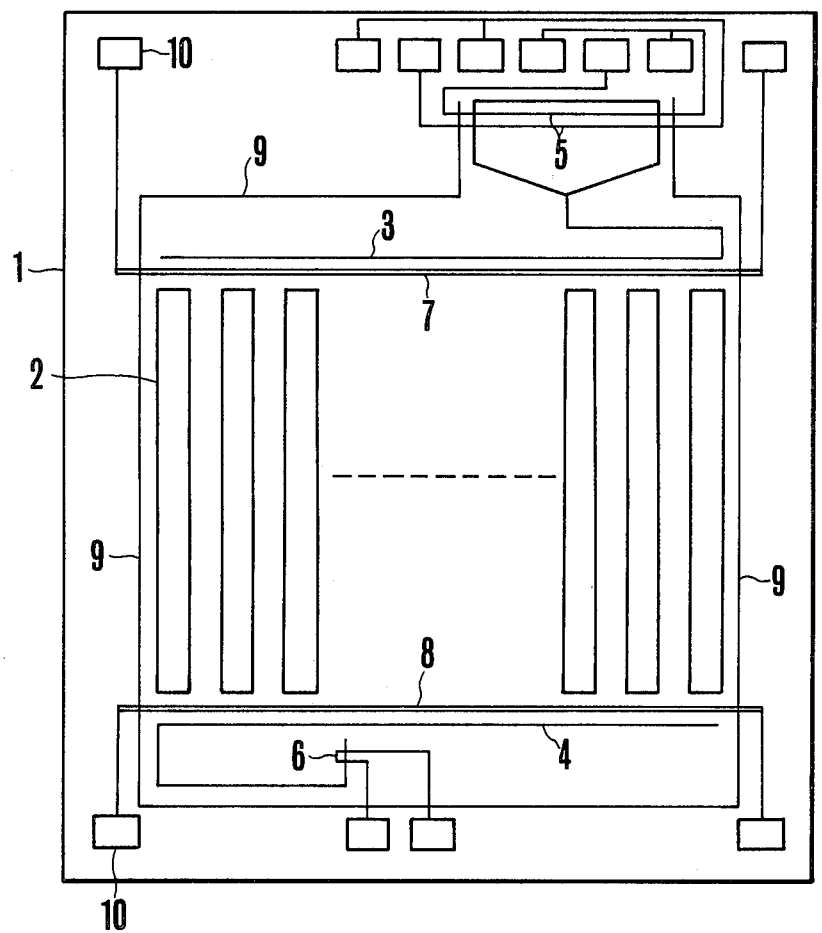
FIG. 1 is an enlarged plan view showing an example of the overall structure of the conventional magnetic bubble memory device.
Figure 3:
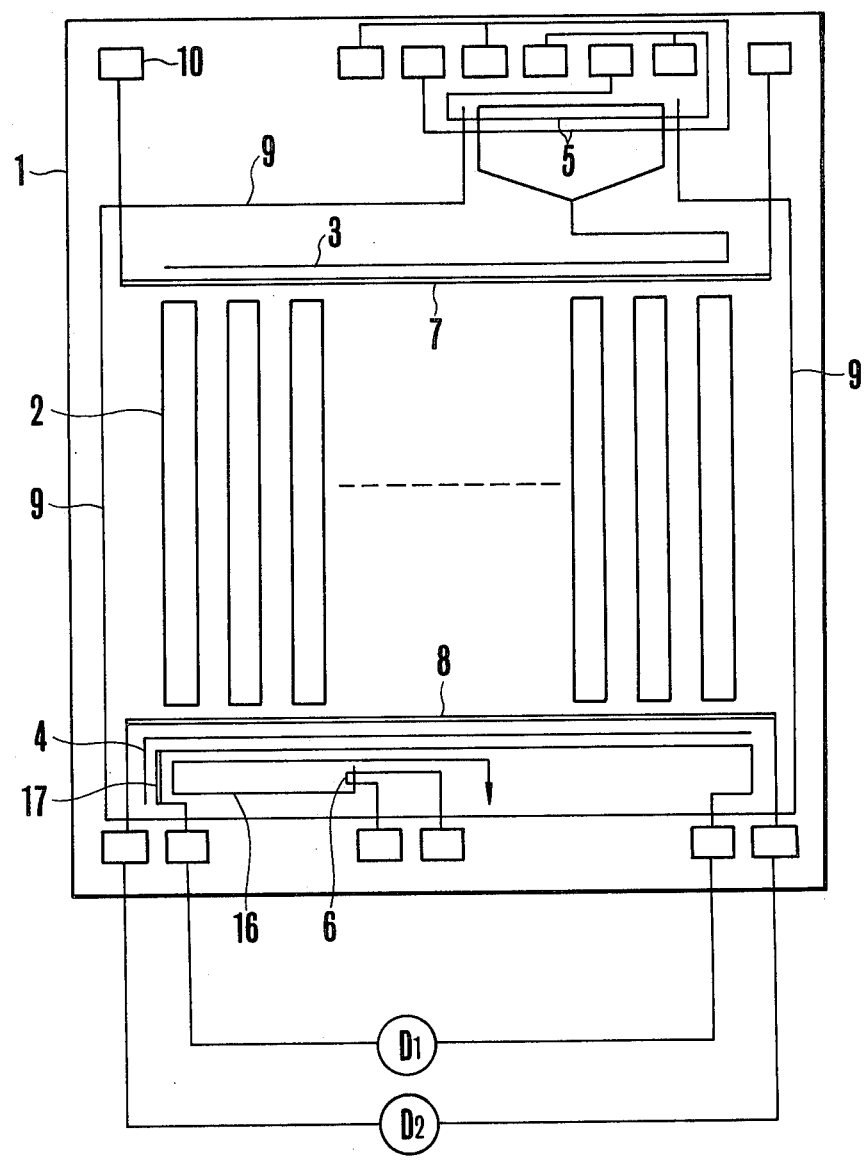
FIG. 3 is an enlarged plan view showing the overall structure of the magnetic bubble memory device embodying the present invention.

Whereas write major line 4 is directly coupled to bubble generator 6 in a conventional device shown in FIG. 1, in the device of this invention in FIG. 3, write major line 4 is disconnected from bubble generator 6, and there is provided between the bubble generator 6 and the write major line 4 a propagation circuit 16 coupled to the bubble generator 6, and a gate means including a transfer gate circuit 17 which transfers magnetic bubbles on the propagation circuit 16 onto the write major line 4. The bubble generator 6 is disposed to intersect the end of the propagation circuit 16, which links through the transfer gate 17 to the write major line 4.

Figure 2:
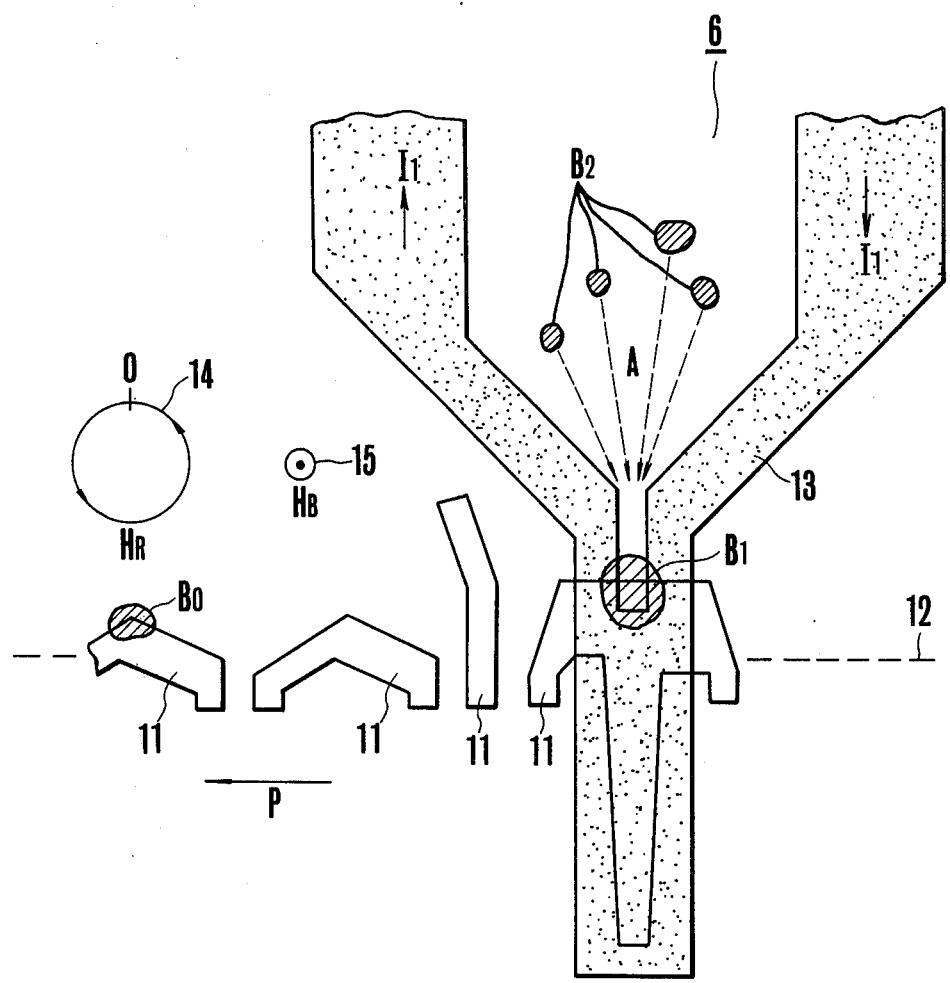
FIG. 2 is a plan view showing a part of a bubble generation and propagation sections of the device of FIG. 1.
Figure 4:
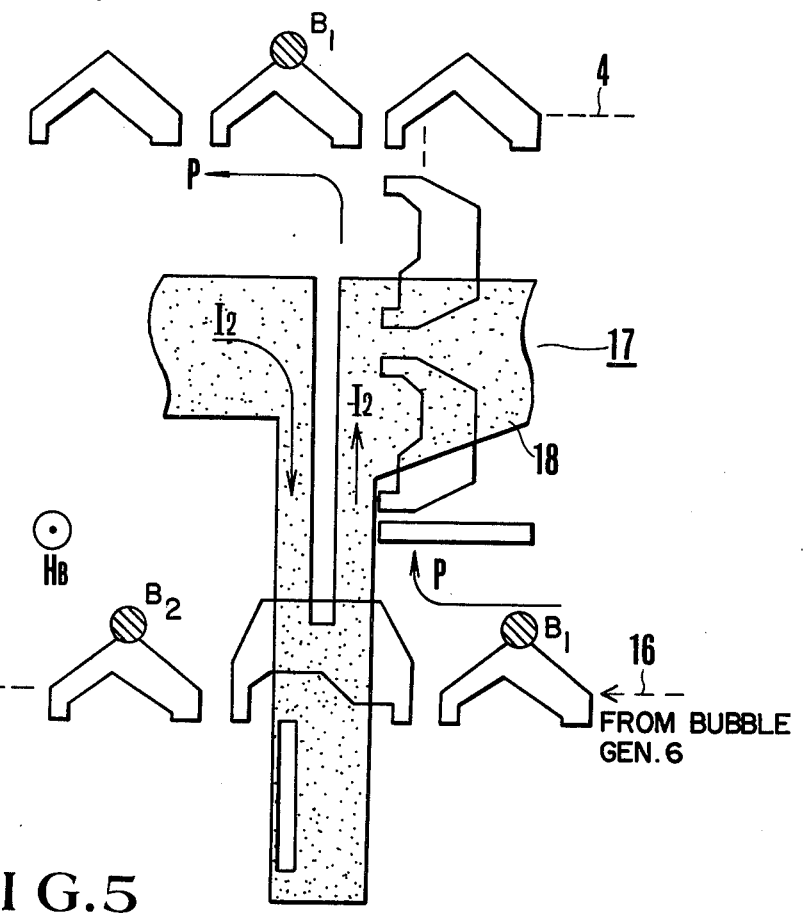
FIG. 4 is a plan view showing a gate means of the device of FIG. 3.

As in FIG. 1 the orientation indicated in FIG. 3 dictates the orientation of the generator 6 of FIG. 2 and the transfer gate 17 of FIG. 4. The generator 6 is oriented the same as in FIG. 1. The transfer gate 17 is oriented to couple to propagation circuit 16 on the right and receive bubbles traveling upward on the vertical leg thereof. The bubble transfer is through gate 17 from right to left and the emerging bubbles travel upward on the vertical leg of write major line 4 and thence across horizontally from left to right as in FIG. 1.

Figure 5:
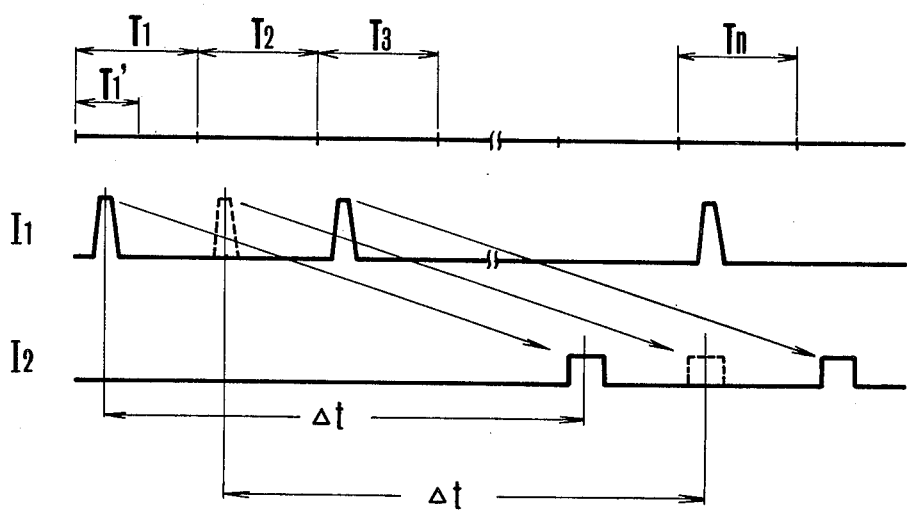
FIG. 5 is a timing chart explaining the magnetic bubble memory device according to the present invention.

In the magnetic bubble memory device structured as described above, a magnetic bubble $B_1$ carrying information "1" generated by the bubble generator 6 is propagated by the rotation of a rotating magnetic field (HR) (not shown in FIG. 4) on the propagation circuit 16, and reaches the transfer gate circuit 17. Following a propagation time of a magnetic bubble traveling from the bubble generator 6 through the propagation circuit 16 to the gate circuit 17, a pulse current $I_2$ is supplied to a hairpin-shaped conductor 18 of the transfer gate circuit 17 shown in FIG. 4, so that the magnetic bubble carrying information "1" is transferred from the propagation circuit 16 onto write major line 4. In this case, pulse current $I_2$ is opposite and small in relation to the bubble generation current $I_1$. Therefore the above-mentioned timing is a timing for transferring information "1". On the other hand, unwanted spurious bubble $B_2$ is propagated from propagation circuit 16 and reaches transfer gate circuit at a timing of transferring information "0". However, the pulse current $I_2$ on hairpin-shaped conductor 18 is suppressed at this timing, so that the spurious bubble $B_2$ is not transferred to write major line 4, and thus it is not stored in minor loop 2. Switching of the pulse current $I_2$ supplied to the hairpin-shaped conductor 18 of transfer gate circuit 17 is carried out after a predetermined period $\Delta t$, i.e., the propagation time of a bubble traveling from bubble generator 6 to gate circuit 17, following a switching operation of the bubble generation pulse current $I_1$ supplied to conductor loop 13 of bubble generator 6, as shown in FIG. 5. In FIG. 5, a write current for information "1" is supplied to conductor loop 13 within a rotating field cycle $T_1'$ in one bit write cycle $T_1$, and after a predetermined period $\Delta t$, the pulse current $I_2$ is supplied to hairpin-shaped conductor 18, so that a magnetic bubble carrying the above-mentioned information "1" is transferred onto write major line 4. Assuming that information "0" is to be written in the next write cycle $T_2$, the pulse current $I_1$ is suppressed (shown at a dotted waveform in FIG. 5), and after a predetermined period $\Delta t$, the pulse current $I_2$ supplied to hairpin-shaped conductor 18 is suppressed (shown at dotted waveform in FIG. 5), so that a spurious bubble, which has entered into propagation circuit 16 when information "0" has been written, is prevented from being transferred onto write major line 4. In the same manner, if information "1" is to be written in write cycle $T_3$, the pulse current $I_2$ is supplied a time $\Delta t$ following the pulse current $I_1$ for generating a bubble carrying information "1".

In this manner, when information "1" is present in write cycle $T_n$, information "101 . . . 1" can accurately be transferred.

Drive sources D1 and D2 in FIG. 3 are current sources for supplying respective pulse currents to transfer gate circuit 17 and transfer-in gate circuit 8 at different timings, respectively. These current sources are well known and further explanation will be omitted.

Figure 6:
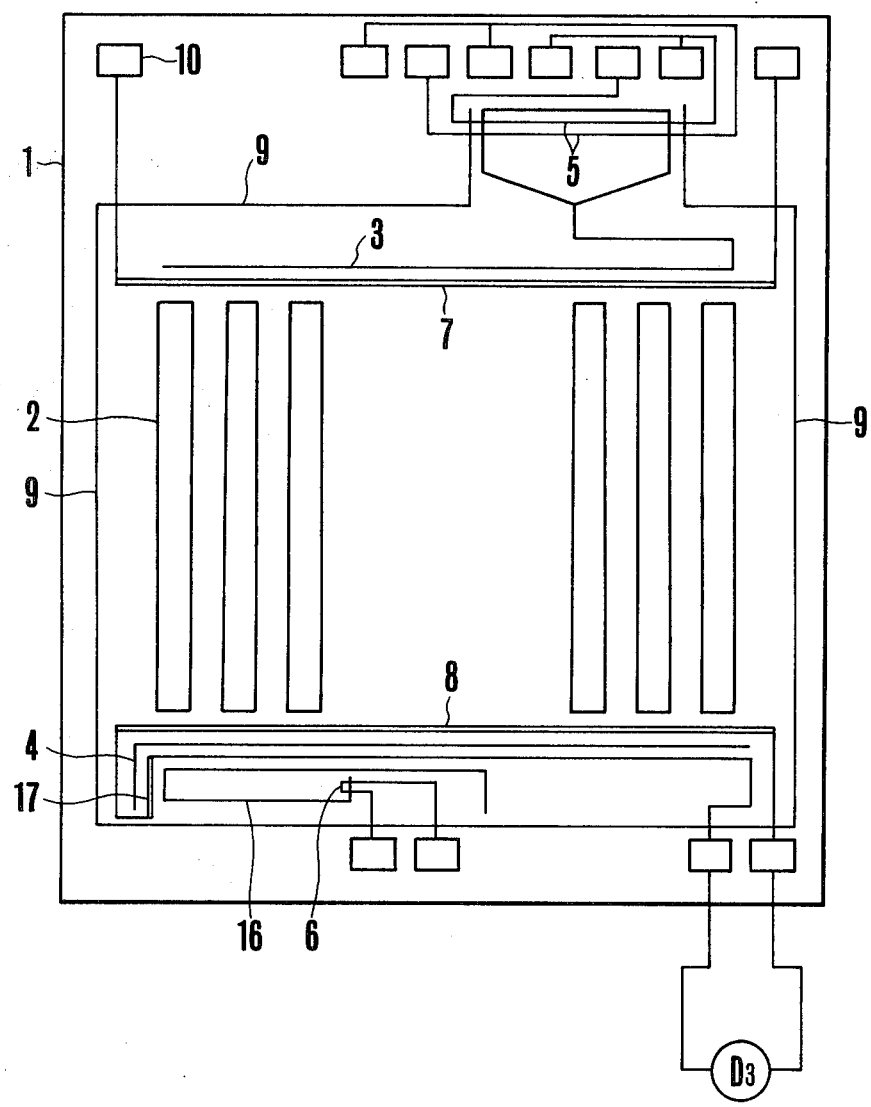
FIG. 6 is an enlarged plan view showing the overall structure of another embodiment of the magnetic bubble memory device according to the present invention.

FIG. 6 shows another embodiment of the magnetic bubble memory device according to the present invention, where transfer gate circuit 17 for transferring magnetic bubbles on propagation circuit 16 onto write major line 4 is connected in series with transfer-in gate circuit 8 for transferring magnetic bubbles on the write major line 4 into minor loop 2. A common drive source D3 which operates in the above-mentioned timings is connected as shown in FIG. 6. In operation, transfer of bubbles first takes place on transfer gate 17, then proceeds to transfer-in gate circuit 8. In this arrangement, the same effect as mentioned above can be obtained with the single drive source D3.

As described above, the present invention eliminates errors of memory operation caused by spurious bubbles which are created in conjunction with data carrier bubbles by the bubble generator, thus effectively enhancing the reliability of writing information into the memory.

What is claimed is:

1. A magnetic bubble memory device comprising;
   a magnetic bubble generator which generates a magnetic bubble carrying information "1" by conducting a pulse current on its hairpin-shaped conductor loop and creating a data having information "0" by suppressing said pulse current;
   a major propagation circuit for propagating said magnetic bubble to a transfer-in gate circuit which transfers said magnetic bubble to a memory storage region; and
   a gate means provided between said magnetic bubble generator and said major propagation circuit for transferring a magnetic bubble carrying information "1" at a predetermined timing and preventing spurious bubbles from being transferred to said major propagation circuit at a second predetermined timing.

2. A magnetic bubble memory device according to claim 1, wherein said first predetermined timing corresponds to a point of time a predetermined period after information "1" has been generated and said second predetermined timing corresponds to a point of time said predetermined period after information "0" has been generated.

3. A magnetic bubble memory device according to claim 1, wherein said gate means comprises a propagation circuit coupled to said magnetic bubble generator, and a transfer gate circuit provided between said propagation circuit and said major propagation circuit, said transfer gate circuit being driven by pulse current source means.

4. A magnetic bubble memory device according to claim 3, said transfer gate circuit is connected in series with said transfer-in gate circuit.

* * * * *